United States Patent
Kim et al.

(10) Patent No.: US 6,798,365 B2
(45) Date of Patent: Sep. 28, 2004

(54) JPEG HUFFMAN TABLE DECODER AND METHOD THEREOF BASED ON BINARY SEARCH TECHNIQUE

(75) Inventors: Tae-Sun Kim, Suwon (KR); Tae-Hwan Park, Kyungsan (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/406,489

(22) Filed: Apr. 4, 2003

(65) Prior Publication Data

US 2004/0001013 A1 Jan. 1, 2004

(30) Foreign Application Priority Data

Jun. 26, 2002 (KR) ........................................ 2002-36069

(51) Int. Cl.[7] ................................................ H03M 7/40
(52) U.S. Cl. ............................ 341/67; 341/65; 341/106
(58) Field of Search ............................. 341/67, 65, 50, 341/106

(56) References Cited

U.S. PATENT DOCUMENTS

| | | | | |
|---|---|---|---|---|
| 5,818,877 A | * | 10/1998 | Tsai et al. | 375/241 |
| 6,023,466 A | * | 2/2000 | Luijten et al. | 370/395.31 |
| 6,121,905 A | * | 9/2000 | Redford | 341/67 |
| 6,650,261 B2 | * | 11/2003 | Nelson et al. | 341/106 |
| 2003/0048207 A1 | * | 3/2003 | Nelson et al. | 341/51 |
| 2003/0174076 A1 | * | 9/2003 | Jang et al. | 341/65 |

OTHER PUBLICATIONS

IBM Technical Disclosure Bulletin, JPEG Huffamn Decoder, vol. 36, pp 455–458, May 1, 1993.*

* cited by examiner

Primary Examiner—Peguy JeanPierre
(74) Attorney, Agent, or Firm—Harness, Dickey & Pierce, P.L.C.

(57) ABSTRACT

A joint photographic expert group (JPEG) Huffman table decoder and a method thereof based on a binary search technique. The JPEG Huffman table decoder performs symbol matching based on the binary search and calculates an address of the matched symbol in code book data. Comparison time and an amount of memory required for searching the symbols are reduced.

17 Claims, 5 Drawing Sheets

FIG. 2

```
(for luminance AC coeffcient coding)
code length of the table
X'00 02 01 03 03 02 04 03 05 05 04 04 00 00 01 7D' set of values
X'01 02 03 00 04 11 05 12 21 31 41 06 13 51 61 07
  22 71 14 32 81 91 A1 08 23 42 B1 C1 15 52 D1 F0

......
    ......

F9 FA'
```

| MAX VALUE | 1110110000000000 | |
|---|---|---|
| CODE STREAM | 1010110010101011<br>1110110010101011<br>1110111010101011 | SMALL<br>EQUALL<br>BIG |
| ONE'S COMPLEMENT<br>OF CODE STREAM | 0101001101010100<br>0001001101010100<br>0001000101010100 | |
| MAX VALUE +<br>ONE'S COMPLEMENT<br>OF CODE STREAM | 1-0011111101010100<br>1111111101010100<br>1111110101010100 | CARRY<br>PATTERN "FF" & NO CARRY<br>NO CAARRY & NO PATTERN |

JPEG HUFFMAN TABLE DECODER AND METHOD THEREOF BASED ON BINARY SEARCH TECHNIQUE

BACKGROUND OF THE INVENTION

This application claims the priority of Korean Patent Application No. 2002-36069, filed Jun. 26, 2002 in the Korean Intellectual Property Office, which is incorporated herein in its entirety by reference.

1. Field of the Invention

The present invention relates to an apparatus and a method for joint photographic expert group (JPEG) decoding, and more particularly, to a JPEG Huffman table decoder and a method thereof based on a binary search technique.

2. Description of the Related Art

A JPEG decoder decodes a compressed image based on a JPEG header and a Huffman table. As the size of the image increases, the performance of the JPEG decoder depends on the performance of the Huffman table. The Huffman table may have run-time configurable characteristics. Accordingly, the Huffman table is used to decode an image by comparing the symbols of the table configured in run-time and a target code stream by two bits.

However, the symbols are not fixed in such a decoding method, and therefore, a decoding method cannot be configured in hard-wired logic. In addition, in the case where the number of 16-bit symbols is more than the half of the number of symbols in the JPEG stream, comparisons may have to be performed as many as eight times on each symbol. Such a method requires a complicated and large midway search tree in order to support a two-bit comparison method.

SUMMARY OF THE INVENTION

Exemplary embodiments of the present invention provide a joint photographic expert group (JPEG) Huffman table decoder and a method thereof to reduce a comparison time for searching for symbols.

Exemplary embodiments of the present invention also provide a JPEG Huffman table decoder and a method thereof that require a reduced amount of memory.

According to an exemplary embodiment, the present invention is directed to a joint photographic expert group (JPEG) Huffman table decoder comprising a code book memory, a pre-processing unit, a symbol matching unit, and a post-processing unit. The code book memory stores code book data. The pre-processing unit receives JPEG code streams. The symbol matching unit performs symbol matching based on a binary search and calculates an address of the matched symbol in the code book memory. The post-processing unit calculates and outputs the level of the symbol.

In an exemplary embodiment, the symbol matching unit may include a first register, a second register, a comparator, a shifter, and an adder. The first register may store reference codes to be compared with the JPEG code streams. The second register may store location information on the reference codes stored in the first register. The comparator compares the JPEG code streams and the reference codes based on the binary search and determines the number of bits of the symbol in response to the comparison result. The shifter performs barrel shifting on the symbol. The adder calculates an address of the symbol in the code book data by using the output data of the shifter and the addresses of the reference codes, which are stored in the second register.

According to another exemplary embodiment, the present invention is directed to a JPEG Huffman table decoding method comprising receiving JPEG code streams, performing symbol matching based on a binary search to determine the number of bits of the symbol, performing barrel shifting according to the symbol matching result, generating an address in a code book memory storing a selected symbol, and calculating and outputting the level of the symbol.

BRIEF DESCRIPTION OF THE DRAWINGS

Exemplary embodiments of the present invention will become more apparent by describing in detail exemplary embodiments thereof with reference to the attached drawings in which:

FIG. 2 illustrates an example of a default Huffman table for a baseline defined in a JPEG header according to an exemplary embodiment of the present invention;

DETAILED DESCRIPTION OF EXEMPLARY EMBODIMENTS OF THE INVENTION

Exemplary embodiments of the present invention will now be described more fully with reference to the accompanying drawings, in which exemplary embodiments of the invention are shown.

Figure 1:
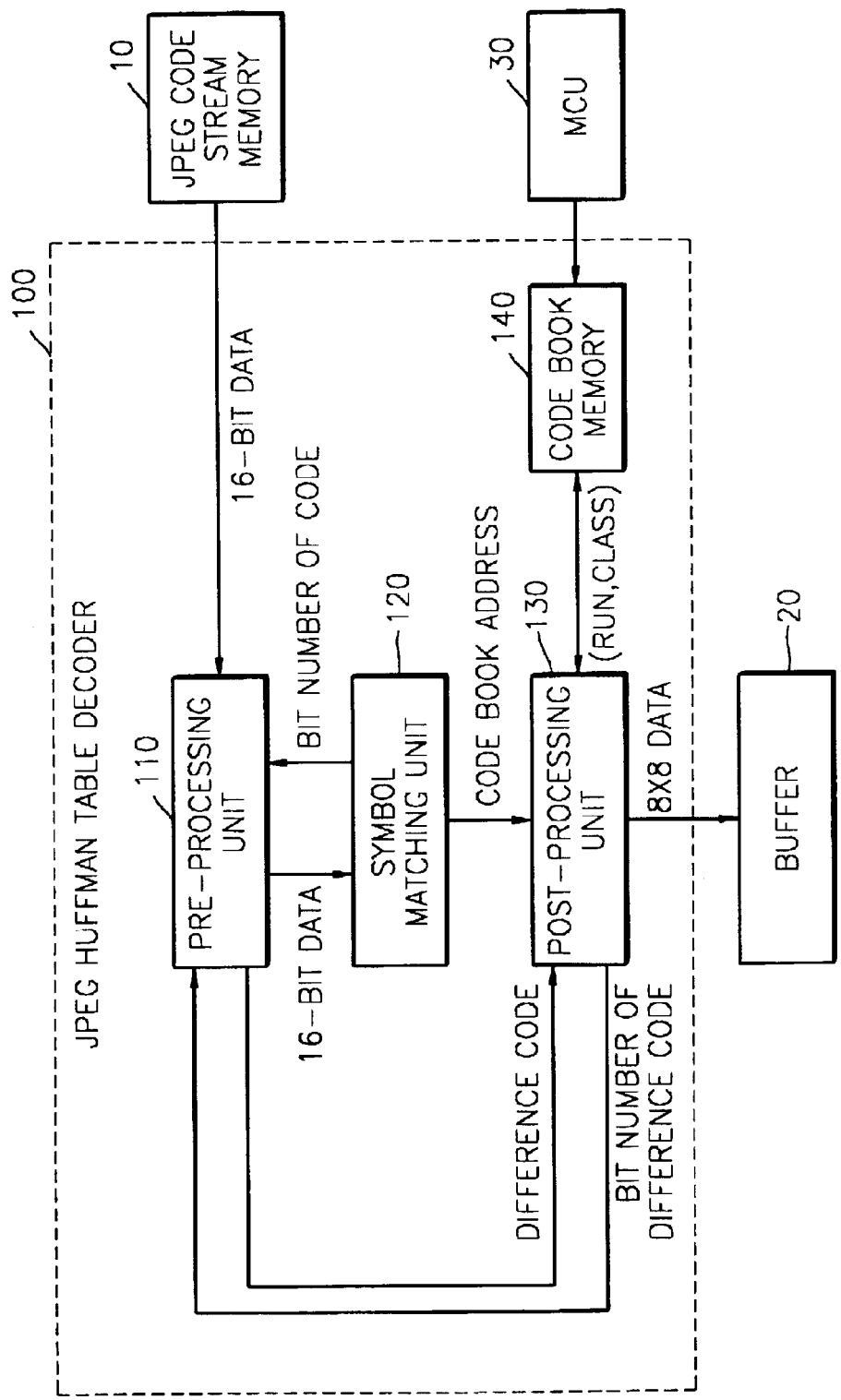
FIG. 1 is a block diagram illustrating a joint photographic expert group (JPEG) Huffman table decoder based on a binary search technique according to an exemplary embodiment of the present invention.

FIG. 1 is a block diagram illustrating a joint photographic expert group (JPEG) Huffman table decoder 100 based on a binary search technique according to an exemplary embodiment of the present invention. Referring to FIG. 1, the JPEG Huffman table decoder 100 includes a pre-processing unit 110, a symbol matching unit 120, a post-processing unit 130, and a code book memory 140.

The code book memory 140 stores code book data, which is configured by a microprocessor unit (MCU) 30 at run-time. The pre-processing unit 110 reads compressed data streams supplied from a JPEG code stream memory 10, i.e., JPEG code streams, in 16-bit units. The symbol matching unit 120 performs a binary search on the read code stream and performs a barrel shift within 16-bit according to the symbol matching so as to calculate the address of the selected symbol in the code book memory 140. The post-processing unit 130 receives a (run, class) value fetched from the address and a difference code remaining in the pre-processing unit 110 to calculate a (run, level) value. In addition, the post-processing unit 130 sequentially stores 8×8 data in a buffer 20 based on a run-length decoded (RLD) order. The above data processing steps are iterated until the code streams are ended. When a marker is input to the post-processing unit 130, the post-processing unit 130 generates an interrupt to process the marker so that the MCU 30 controls data processing. In an exemplary embodiment, when eight bits of ones are iterated and none of the subsequent eight bits is zero, the subsequent data is referred to as the marker. The above marker is exemplary, and any other sequence of bits could be used as a marker, as would be known to one of ordinary skill in the art.

The code book data stored in the code book memory 140 is configured by the external MCU 30, which decodes a JPEG header, at run-time. The external MCU 30, which may be a JPEG header decoder for decoding a Huffman table descriptor described in the JPEG header, processes the marker inserted into the image data.

The code book memory 140 includes random access memory (RAM) having an exemplary size of 256×8 for each component. When the code book memory 140 supports only the JPEG default Huffman table, the code book memory 140 includes RAM having a size of 512×8 for each of luminance and chrominance. Again, this size memory is exemplary, and other size memories could be utilized, as would be know to one of ordinary skill in the art.

FIG. 2 is an example of the default Huffman table, which is defined in the JPEG header. Referring to FIG. 2, the code book data is completed by sequentially storing the code stream of "01 02 03 00 04 . . . F9 FA", which is described at a lower portion of FIG. 2, in the continuous address of the RAM.

Figure 3:
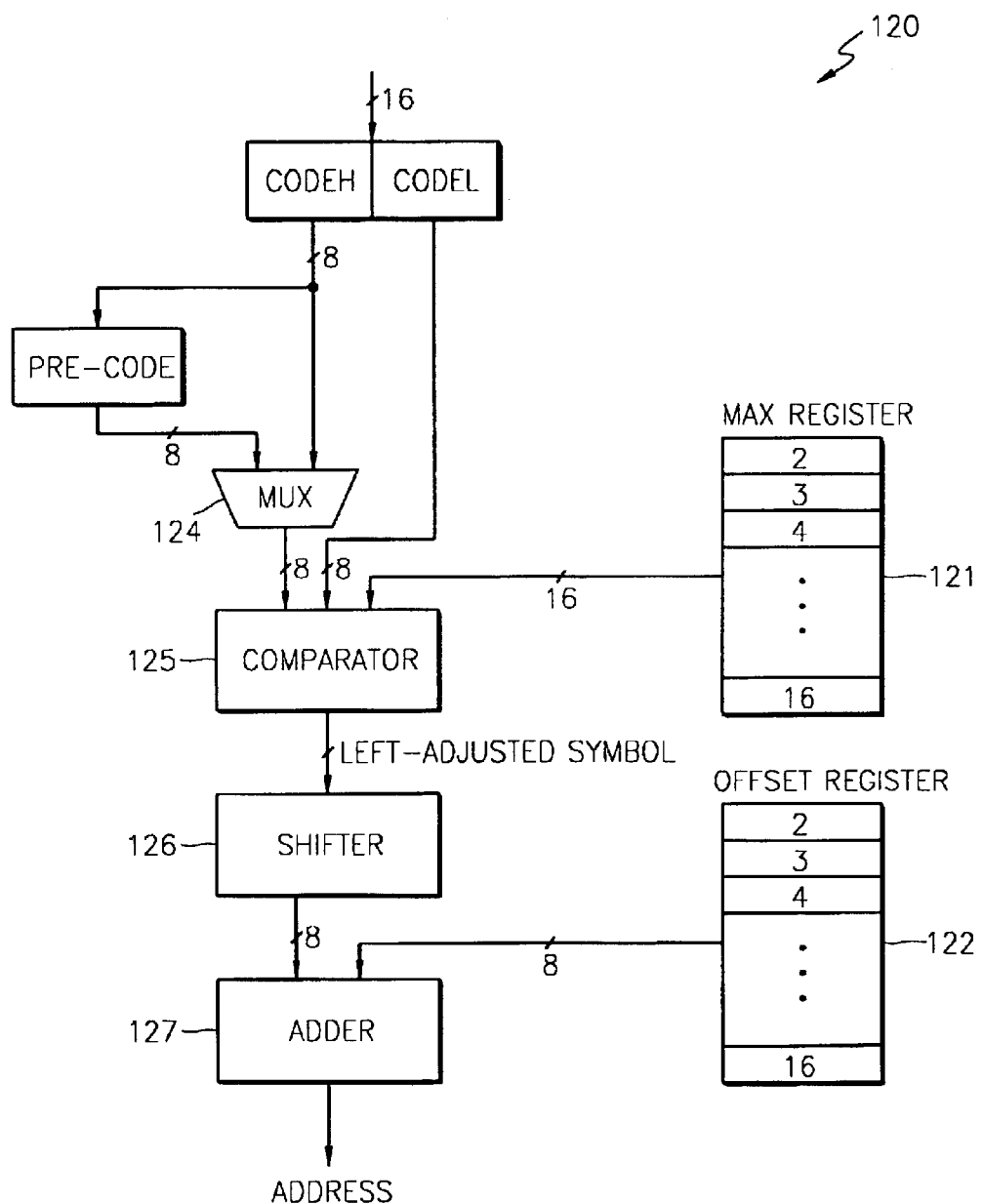
FIG. 3 is a block diagram of a symbol matching unit of FIG. 1 according to an exemplary embodiment of the present invention.

FIG. 3 is a block diagram of the symbol matching unit 120 of FIG. 1. Referring to FIG. 3, the symbol matching unit 120 includes a MAX register 121, an offset register 122, a multiplexer 124, a comparator 125, a shifter 126, and an adder 127 to perform symbol matching and address generating based on a binary search.

The MAX register 121 stores the last of the codes having the same bit as each of the 1- through 16-bit symbols, which are defined in the Huffman table. The codes may be MAX codes having the largest values of each of the 1 through 16-bit symbols. Although the maximum values in an aligned array structure are used as representative values for the comparison, minimum or other values may be used as the representative values.

The offset register 122 stores the location information on the MAX codes of the MAX register 121, in the code book memory 140.

The 16-bit code streams input from the pre-processing unit 110 are formed in a left-adjusted type. The multiplexer 124 outputs the left 8-bit data codeH of the 16-bit code stream input from the pre-processing unit 110 to the comparator 125. Where the values of the left 8-bit data codeH are all ones, pre-code data pre_code, which is formed of eight zeros, is output to the comparator 125, instead of the data codeH. A circuit may be used to perform such a data reconstruction process in the pre-processing unit 110 instead of the symbol matching unit 120.

The comparator 125 receives the 8-bit data codeH or pre_code input from the multiplexer 124 and the right 8-bit data codeL of the 16-bit code stream input from the pre-processing unit 110. Thereafter, the comparator 125 compares 16-bit data, which is formed by concatenating the 8-bit data codeH or pre_code and codeL, with the MAX codes, which are sequentially defined in the MAX register 121. Thus, the comparator 125 determines the number of bits of the corresponding code based on the comparison result. The comparator 125 may be realized as a one's complement adder.

The shifter 126, manifested as a barrel shifter, converts left-adjusted symbols input from the comparator 125 into right-adjusted symbols.

The adder 127 generates the address of the selected symbol in the code book memory 140 by using the data input from the shifter 126 and the addresses of the MAX codes stored in the offset register 122. The adder 127 may be formed of an 8-bit adder and realized as a one's complement adder in order to complement the differences of ones, which are generated when realizing the comparator 125 as a one's complement adder.

As is widely known, the JPEG Huffman table is formed of arrays, which are aligned in increasing order. Accordingly, the comparator 125 performs the following comparison based on the binary search technique by using the characteristics of the Huffman table.

When the code stream is input from the pre-processing unit 110 to the comparator 125, the comparator 125 compares the input code stream with an 8-bit MAX code. If the corresponding code is smaller than the 8-bit MAX code, the comparator 125 compares the code with a 4-bit MAX code. If the corresponding code is larger than the 8-bit MAX code, the comparator 125 compares the code with a 12-bit MAX code. By performing such comparison based on the binary search technique, the 16-bit code is compared in a maximum of five cycles.

As described above, the binary search technique can rapidly search for a desired item from an aligned continuous list. In the binary search technique, a key to be searched is not compared with the first item or the last item of the list in an increasing or decreasing order, but is compared with an item located in the middle of the list. Thereafter, one or more of the following processes may be performed according to the comparison result.

When the key to be searched is smaller than the compared item and the data remains to be searched, the binary search is performed on the portion of the list smaller than the compared item. When the key to be searched is the same as the compared item, the value to be searched is the compared item so the searching operation is ended. When the key to be searched is larger than the compared item and data remains to be searched, the binary search is performed on the portion of the list larger than the compared item.

The binary search technique iterates the comparison of the key to be searched with the item in the middle of the half of the list including the data until the key to be searched is found or the remaining group to be searched is small. Since the comparison is performed on data included in a given range, the search cycles are reduced compared to the case where the comparison is performed on the first item or the last item of the list in increasing or decreasing order.

Furthermore, the comparator 125 according to exemplary embodiments of the present invention reduces the comparison cycles to a million instructions per second (MIPS) level, which is required in the JPEG decoder. To this end, the comparator 125 performs a 2-set comparison where the MAX register 121 is separated into more than two sets and the separated sets are compared at the same time. This comparison method is also based on the binary search technique.

Figures 4, 5:
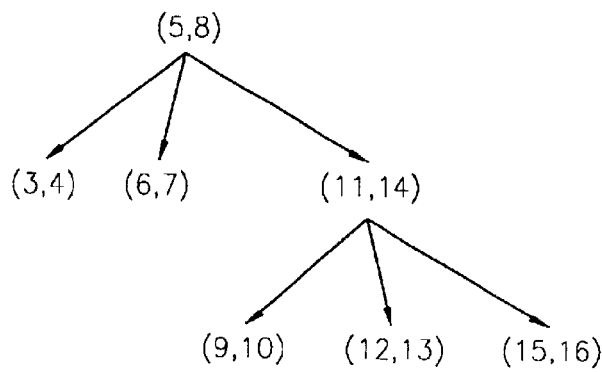
FIG. 4 illustrates a 2-set comparison operation of a comparator of FIG. 3 according to an exemplary embodiment of the present invention.
FIG. 5 illustrates the operation of the comparator of FIG. 3 according to an exemplary embodiment of the present invention.

FIG. 4 illustrates the 2-set comparison operation of the comparator 125 of FIG. 3 in an exemplary embodiment of the present invention. The MAX sets of FIG. 4 may, for example, be the MAX sets stored in the MAX register 121 of FIG. 3.

Referring to FIG. 4, when performing the 2-set comparison, the comparator 125 compares the code stream input from the pre-processing unit 110 with a (5, 8) MAX set. When the code stream is included in the range of the (5, 8) MAX set, the comparator 125 compares the code stream with a (6, 7) MAX set. When the bit stream is larger than 6-bit MAX code and smaller than 7-bit MAX code, the comparator 125 determines that the bit stream is a 7-bit code.

In the case where such a 2-set comparison is performed, the number of cycles required in the comparison is equal to or less than three. Here, the comparisons are performed in the order of (5, 8), (11, 14), and (15, 16) MAX sets.

The symbol matching unit 120 may include one comparator 125 or more than two comparators 125 to perform such operations. When more than two comparators 125 are used, the MIPS level can be improved by arranging a separate comparator dedicated for the comparison of 2-bit codes, which have high probability of use, in the symbol matching unit 120.

In order to further improve or optimize the circuit 120, the comparator 125 according to exemplary embodiments of the present invention is realized as a one's complement adder and may satisfy the following conditions.

The codes to be compared may be variable length codes of 1-bit through 16-bit, which are formed as the left-adjusted type. The comparison result need not be changed by the remaining bits which exceed the effective length of the symbol. In other words, since the remaining (16-n) bits of the input code represent the subsequent symbol or difference code information when the symbol to be compared has a length of n bits, the remaining bits most likely do not affect the comparison result of the present symbol. For example, when the comparator is realized as a two's complement adder, a carry occurs so that the entire 16 bits affect the comparison result. Accordingly, the comparator 125 according to exemplary embodiments of the present invention is realized as a one's complement adder to prevent the occurrence of carry. In addition, the differences of ones, which occur due to the one's complement adder, are complemented by realizing the adder 127, which is connected to the comparator 125, as the one's complement adder.

FIG. 5 illustrates the operation of the comparator 125 of FIG. 3. Referring to FIG. 5, the comparator 125 adds the n-bit MAX value, wherein n is equal to or less than 16, to the one's complemented value of the input code stream to check for the occurrence of a carry. If a carry occurs after the addition, it is determined that the input code has a value smaller than the MAX value. Otherwise, it is determined that the input code has a value equal to or larger than the MAX value. When the values of the n bits at the left side of the comparison result of the comparator 125 are ones when comparing n bits, it is determined that the input code has the same value as the MAX value.

When more than two MAX register sets are formed, the comparison with the 8-bit MAX value may be performed in the first cycle and the optimum location for reducing the cycles in the 2-set comparison for 1-bit through 16-bit is (5, 10).

Figure 6:
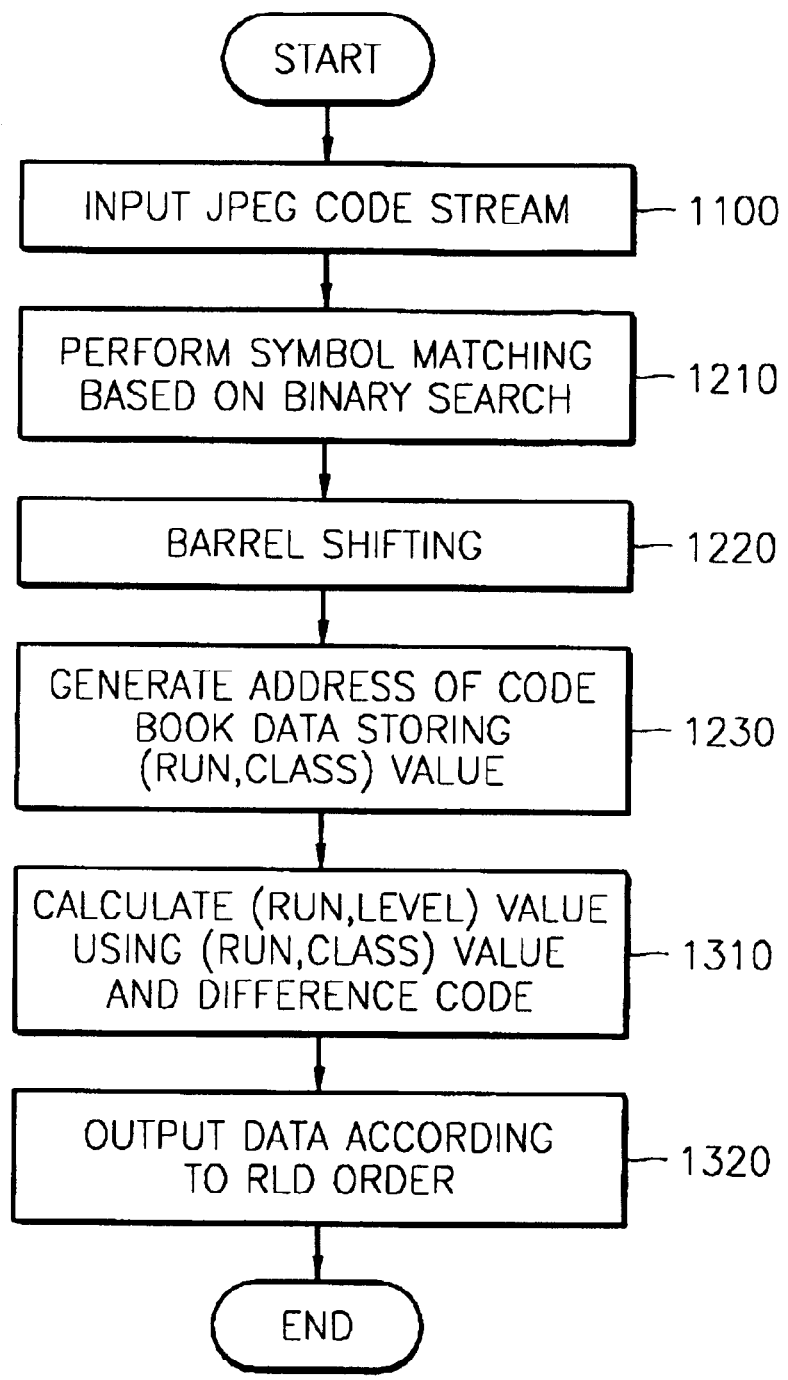
FIG. 6 is a flowchart illustrating a decoding method of a JPEG Huffman table based on a binary search technique according to an exemplary embodiment of the present invention.

FIG. 6 is a flowchart illustrating a JPEG Huffman table decoding method based on the binary search technique according to an exemplary embodiment of the present invention.

Referring to FIG. 6, the JPEG Huffman table decoder 100 according to an exemplary embodiment of the present invention receives a 16-bit JPEG code stream from the pre-processing unit 110 in step 1100.

Thereafter, the JPEG Huffman table decoder 100 performs a symbol matching operation using the symbol matching unit 120 in step 1210. Here, the symbol matching of step 1210 is performed based on the binary search technique and the number of bits of the symbol is determined by the search operation. When the left eight bits codeH of the code stream input from the pre-processing unit 110 is formed of ones and the code is not a marker, eight zeros may be inserted due to the characteristics of the JPEG code. Accordingly, eight zeros are shifted out and the comparison is continued for the 16 bits formed by connecting the shifted out eight zeros and the right eight bits codeL of the code stream.

Thereafter, barrel shifting is performed according to the symbol matching result of step 1210, in step 1220, and the address of the (run, class) value in the code book memory 140 is generated in step 1230.

The address of the desired symbol in the code book memory 140 may be calculated using exemplary Formula 1.

$$\text{address of MAX code} - (\text{MAX symbol value} - \text{symbol value}) \quad (1)$$

The adder 127 included in the symbol matching unit 120 calculates the relative location of the MAX symbol and the target symbol and subtracts the calculated relative location from the absolute address of the MAX symbol according to exemplary Formula 1. Accordingly, the adder 127 obtains the address of the (run, class) value in the code book memory 140.

Thereafter, the post-processing unit 130 obtains a (run, level) value by using the (run, class) value fetched from the code book memory 140 and the difference code remaining in the pre-processing unit 110 in step 1310, and sequentially outputs 64-bit data according to the RLD order in step 1320. The above-processes may be iterated until the end of the code streams.

As described above, according to exemplary embodiments of the JPEG Huffman table decoder and exemplary embodiments of the method thereof based on the binary search technique, the comparison time required for searching for symbols is reduced and the amount of memory required for searching for symbols is reduced compared to the amount required for a midway search tree.

The exemplary embodiments of a JPEG Huffman table decoder described above are usable as part of an entropy decoder. Typical entropy decoders also include a post-entropy decoder (PED). The entropy coder is further normally a constituent part of a JPEG decoder. Discrete cosine transform (DCT)-JPEG decoders typically receive a compressed image via an entropy decoder, which divide coefficients into DC coefficients and AC coefficients. The DC coefficients are processed by a differential pulse code modulation (DPCM) decoder and the AC coefficients are processed by a run-length decoder. Outputs of the DPCM decoder and run-length decoder are dequantized, and then inverse DCT, to yield a reconstructed image.

Still further, although exemplary embodiments of the present invention are related to decoding, it would be know to one of ordinary skill in the art that the reverse of these processes could be utilized to encode a source image into a compressed image.

Still further, although exemplary embodiments of the present invention have been described above in conjunction with a binary search technique, other divide-and-conquer techniques could also be utilized in place of, or in addition to, a binary search technique, as would be known to one of ordinary skill in the art. These alternatives include, but are not limited to, hash tables, search trees, red-black trees, skip lists, and augmented data structures.

While the present invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A joint photographic expert group (JPEG) Huffman table decoder comprising:
   a code book memory for storing code book data;
   a pre-processing unit for receiving JPEG code streams;
   a symbol matching unit for performing symbol matching based on a binary search and calculating an address of the symbol in the code book memory; and
   a post-processing unit for calculating and outputting a level of the symbol.

2. The JPEG Huffman table decoder of claim 1, wherein the JPEG code streams input from the pre-processing unit are formed in a left-adjusted type.

3. A joint photographic expert group (JPEG) Huffman table decoder comprising:
   a code book memory for storing code book data;
   a pre-processing unit for receiving JPEG code streams;
   a symbol matching unit for performing symbol matching based on a binary search and calculating an address of the symbol in the code book memory; and
   a post-processing unit for calculating and outputting a level of the symbol,
   wherein the symbol matching unit includes:
      a first register for storing reference codes to be compared with the JPEG code streams;
      a second register for storing address information for the reference codes stored in the first register;
      a comparator for comparing the JPEG code streams and the reference codes based on the binary search and determining the number of bits of the symbol in response to the comparison result;
      a shifter for performing barrel shifting on the symbol; and
      an adder for calculating an address of the symbol in the code book data by using the output data of the shifter and the location information of the reference codes.

4. The JPEG Huffman table decoder of claim 3, wherein the reference codes are codes having maximum values among the codes having the same bits as the 1-bit through 16-bit symbols defined in a Huffman table.

5. The JPEG Huffman table decoder of claim 3, wherein the reference codes are codes having minimum values among the codes having the same bits as the 1-bit through 16-bit symbols defined in a Huffman table.

6. The JPEG Huffman table decoder of claim 3, wherein the shifter converts left-adjusted symbols output from the comparator into right-adjusted symbols.

7. The JPEG Huffman table decoder of claim 3, wherein the comparator is a one's complement adder.

8. The JPEG Huffman table decoder of claim 7, wherein the adder is a one's complement adder to complement differences of ones generated by the comparator.

9. The JPEG Huffman table decoder of claim 3, wherein the adder calculates the address of the symbol in the code book by calculating a relative location of the reference code and a target symbol and subtracting the relative location from the absolute address of the reference code.

10. The JPEG Huffman table decoder of claim 3, wherein the symbol matching unit further includes a multiplexer for outputting pre-code data, formed by substituting N (where N>0) zeros for the left N bits of data of the JPEG code streams input from the pre-processing unit when the left N bits of data is formed of all ones.

11. The JPEG Huffman table decoder of claim 3, wherein the first register is separated into at least two sub-registers to increase a decoding rate.

12. The JPEG Huffman table decoder of claim 3, wherein the symbol matching unit includes at least two comparators to increase a decoding rate.

13. A JPEG Huffman table decoding method comprising:
   (a) receiving JPEG code streams;
   (b) performing symbol matching based on a binary search to determine the number of bits of the symbol;
   (c) performing barrel shifting according to the symbol matching result;
   (d) generating an address in a code book memory storing a selected symbol; and
   (e) calculating and outputting the level of the symbol.

14. The JPEG Huffman table decoding method of claim 13, wherein the address is calculated by calculating a relative location of a target symbol and a reference code and subtracting the relative location from the absolute address of the reference code in (d).

15. The JPEG Huffman table decoding method of claim 14, wherein the reference codes are codes having maximum values among the codes having the same bits as the 1-bit through 16-bit symbols defined in a Huffman table.

16. The JPEG Huffman table decoding method of claim 14, wherein the reference codes are codes having minimum values among the codes having the same bits as the 1-bit through 16-bit symbols defined in a Huffman table.

17. A JPEG Huffman table decoder performing the method of claim 13.

* * * * *